United States Patent [19]

Nazarathy et al.

[11] Patent Number: 4,843,586
[45] Date of Patent: Jun. 27, 1989

[54] DISTRIBUTED SAMPLING OF ELECTRICAL AND OPTICAL SIGNALS USING CODED SWITCHED ELECTRODE TRAVELLING WAVE MODULATORS

[75] Inventors: Moshe Nazarathy, Mountain View; David W. Dolfi, Los Altos; Brian H. Kolner, Woodside, all of Calif.

[73] Assignee: Hewlett-Packard Company, Palo Alto, Calif.

[21] Appl. No.: 43,506

[22] Filed: Apr. 28, 1987

[51] Int. Cl.[4] .................... G06G 9/00; G01B 9/02
[52] U.S. Cl. ....................... 364/822; 350/96.14; 356/345
[58] Field of Search ............ 364/822, 807, 845, 728, 364/604; 350/96.12, 96.13, 96.14, 162.12, 162.13, 162.14; 356/345, 349, 351; 455/600, 609–612; 332/7.51

[56] References Cited

U.S. PATENT DOCUMENTS

| | | | |
|---|---|---|---|
| 4,005,927 | 2/1977 | Caton | 350/96.14 |
| 4,446,425 | 5/1984 | Valdmanis et al. | 324/96 X |
| 4,456,877 | 6/1984 | Brown | 364/485 X |
| 4,505,587 | 3/1985 | Haus et al. | 356/345 |
| 4,575,179 | 3/1986 | Lee et al. | 350/96.13 |
| 4,603,293 | 7/1986 | Mourou et al. | 324/96 |
| 4,699,513 | 10/1987 | Brooks et al. | 356/345 |

FOREIGN PATENT DOCUMENTS 2175101 11/1986 United Kingdom .

OTHER PUBLICATIONS

Izutsu et al.—"Picosecond Signal Sampling and Multiplication by Using Integrated Tandem Light Modulators"—Journal of Lightwave Technology, vol. LT-1, No. 1, Mar. 1983.
Molter-Orr et al.—"20 GHz Optical Waveguide Sampler"—IEEE Journal of Quantum Electronics, vol. QE-19, No. 12, Dec. 1983; pp. 1877–1883.

Primary Examiner—Joseph Ruggiero
Attorney, Agent, or Firm—John A. Frazzini

[57] ABSTRACT

A sampler that can be used to sample optical or electrical signals, having an improved sensitivity-resolution product compared to conventional samplers. A coded switched electrode modulator has electrodes that produce polarity reversals in an applied voltage signal in accordance with a pseudorandom code having small sidelobes. An optical signal is injected into an optical waveguide that is oriented parallel to the electrodes. When the optical signal is proportional to the coded electrode pattern, the device is used as an electrical sampler. When the applied voltage signal is proportional to the coded electrode pattern, the device is used as an optical sampler.

19 Claims, 4 Drawing Sheets

DISTRIBUTED SAMPLING OF ELECTRICAL AND OPTICAL SIGNALS USING CODED SWITCHED ELECTRODE TRAVELLING WAVE MODULATORS

BACKGROUND OF THE INVENTION

This invention relates in general to systems for sampling electrical and optical signals and relates more particularly to a sampler that utilizes a traveling wave modulator. In a typical prior sampler, an optical waveguide is formed in a substrate parallel to the top planar surface of the substrate and a microstrip delay line is formed on top of the substrate in a direction perpendicular to the direction of the optical waveguide. The substrate is formed of a material, such as $LiNbO_3$ that exhibits a change in index of refraction when an electric field is applied to the substrate. For a given direction of transmission of light in the substrate, the substrate exhibits an ordinary index of refraction for a first polarization of the light and exhibits an extraordinary index of refraction for the polarization perpendicular to the first. Since the optical signal propagation velocity is equal to the speed of light divided by the index of refraction, each of these two polarization directions represents a distinct light propagation channel with different velocities. In order to avoid breaking up the optical signal into two signals that travel at different velocities in the two different channels, the light in the waveguide is polarized along one of these two directions of polarization.

The delay line is located over the optical waveguide so that electrical signals in the delay line will interact (e.g., electrooptically or electroelastically) with optical signals in the optical waveguide. The electric field produced by the signals in the waveguide affects the propagation velocity of optical signals in the optical waveguide. This shows up as a time delay of an optical signal pulse and as phase modulation of a continuous wave optical signal. This phase modulation is converted to amplitude modulation by interfering this optical signal with a reference optical signal. An optical receiver detects this amplitude modulation. Since the amount of amplitude modulation is proportional to the strength of the electric field in the electrical signal, the optical pulse injected in the optical waveguide samples the electrical signal at the point in the delay line where the optical waveguide passes under the delay line. As the relative delay between the electrical and optical signals is varied, the output signal of the optical receiver maps samples of the waveform under test versus the relative delay.

System sensitivity is inversely proportional to the electro-optic half-wave voltage $V_\pi$ (which is the DC half-wave voltage required to generate a phase shift of $\pi$ radians) and is directly proportional to the square root of the average power in the optical signal. The output signal from the optical detector can be increased by increasing the energy in the optical pulse. This can be achieved by increasing the power density of the pulse or by increasing the duration of the pulse. Unfortunately, the power density is limited by practical limitations. High power lasers are typically large and expensive. Although small size semiconductor lasers are less expensive and more adaptable to portable systems, a substantial increase in average power can only be achieved by increasing the pulse width which degrades system resolution.

The energy per pulse can also be increased by increasing the pulse width of the optical pulse. However, such increased pulse width also equally decreases the resolution of the sampler. Thus, it would be advantageous to have a new sampler design that improves the sampler sensitivity without these disadvantages.

SUMMARY OF THE INVENTION

In the following discussion, the first digit of the reference numeral of an element will indicate the first figure in which that elements is presented.

DEFINITIONS

The "convolution" of h(t) with V(t) is denoted as $h(t) \otimes V(t)$ and is defined by $$h(t) \otimes V(t) = \int_{-\infty}^{\infty} h(t-s) \cdot V(s) ds \qquad (1)$$

The "correlation" of h(t) with V(t) is denoted as h(t)*V(t) and is defined by $$h(t)*V(t) = \int_{-\infty}^{\infty} h(s)V(s+t)ds \qquad (2)$$

The "correlation with offset k" of the signal $P = (P_0, \ldots, P_{M-1})$ with a signal $Q = (Q_0, \ldots, Q_{M-1})$ is defined by the relationship:

$$(P*Q)_k = \sum_{m=0}^{M-1} P_m \cdot Q_{m+k} \qquad (3)$$

A pair of codes $G^1 = (G^1_0, \ldots, G^1_{M-1})$ and $G^2 = (G^2_0, \ldots, G^2_{M-1})$ form a "conjugate Golay pair" if and only if they satisy the relationship:

$$(G^1*G^1)_k + (G^2*G^2)_k = 2M \cdot \delta_{0k} \qquad (4)$$

where $\delta_{0k}$ is the Kroneker delta function.

The "kth order sidelobe" of a code $P = (P_0, \ldots, P_{M-1})$ is defined to be the correlation with offset k of P with itself (i.e., $(P*P)_k$).

A pseudorandom code P "has small sidelobes" when $(P*P)_k$ is small compared to $(P*P)_0$ for $k \neq 0$.

SUMMARY

A sampler is presented that enables a great improvement in sensitivity over conventional samplers, without degrading sampler resolution. This new sampler utilizes a continuous wave laser source and provides a substantially higher sensitivity-resolution product than the conventional systems. To obtain this increased sensitivity, the sampler utilizes a substrate in which an optical waveguide has been formed parallel to the top surface of the substrate and on the top of which an electrical delay line has been formed parallel to and directly over the optical waveguide. This enables the electrical and optical signals to interact over the length of the delay line instead of only over the much smaller width of the delay line as in the conventional sampler. This results in an improvement of a few orders of magnitude in sensitivity relative to a convention sampler because the modulation switching voltage drops from a few Kilovolts to a few volts.

Unfortunately, the optical and electrical signals do not propagate at the same velocity. The relative velocity of these two signals results in the optical pulse travelling along the electrical signal and thereby experiencing a time delay that is equal to a running average of the electrical signal over a moving window equal to the difference in transit times between the electrical and optical signals, thereby smearing the output signal. This amounts to low-pass filtering the electrical waveform through a bandwidth which is of the order of 10 GHz for a 1 cm long LiNbO$_3$ modulator.

In order to regain the bandwidth, the improved system utilizes a coded phase reversal modulator of the type presented in copending U.S. patent application Ser. No. 004,996, the specification of which is hereby incorporated by reference. In such a modulator, pseudorandom phase reversals in the electrodes serve to compensate for the walkoff between the electrical and optical signals. The pattern of the phase reversals is based on a pseudorandom code $P=(P_0, \ldots, P_{M-1})$ so that for a constant voltage V across the electrodes, the applied electric field as a function of the distance z along the electrodes has the form $$h(z) = \sum_{m=0}^{M-1} P_m \cdot p(z - mw) \quad (5)$$

where w equals the length L of the electrodes divided by M and p(z-mw) equals one for $mw < z \leq (m+1)w$ and is zero otherwise. Nevertheless, the application of this modulator to a sampler is not straightforward because, in the modulator, it is in the frequency domain that improved operation is exhibited instead of in the time domain as required here. In fact, the time domain response of the modulator exhibits a structure which duplicates the spatial switched electrode pattern of code, but is not shorter than the response of a conventional device, lasting for as long as the transit time difference.

In accordance with this invention, the output signal from this coded switched electrode travelling wave modulator is detected by a slow optical detector (i.e., an optical detector whose response is slow compared to the typical frequencies of the modulator) to produce an output signal O(t) proportional to $I(t)*\cos^2[[h(t) \otimes V(t)+\phi] = I(t)*[1+\cos(2h(t) \otimes V(t)+\phi)]/2$ where I(t) is the intput light intensity, h(t) is the modulator impulse response, V(t) is the electrical wave being sampled, $\phi$ is a phase factor determined by a geometric and/or electric bias, *denotes a correlation operation and denotes a convolution operation. In those embodiments in which $\phi$ is an odd integral multiple of $\pi/2$, the cosine function becomes a sine function which can be approximated by its first order power series expansion to give that O(t) is proportional to I(t)*h(t) V(t). Samples of the electrical signal with a resolution equal to that of a single pulse are produced by selecting I(t) to be a temporal replica of h(s). This system can also be used as an electrical sampler of optical waves by utilizing a voltage signal V(t) that is a temporal replica of h(s).

DESCRIPTION OF THE PREFERRED EMBODIMENT

Figures 1A, 1B, 2, 3:
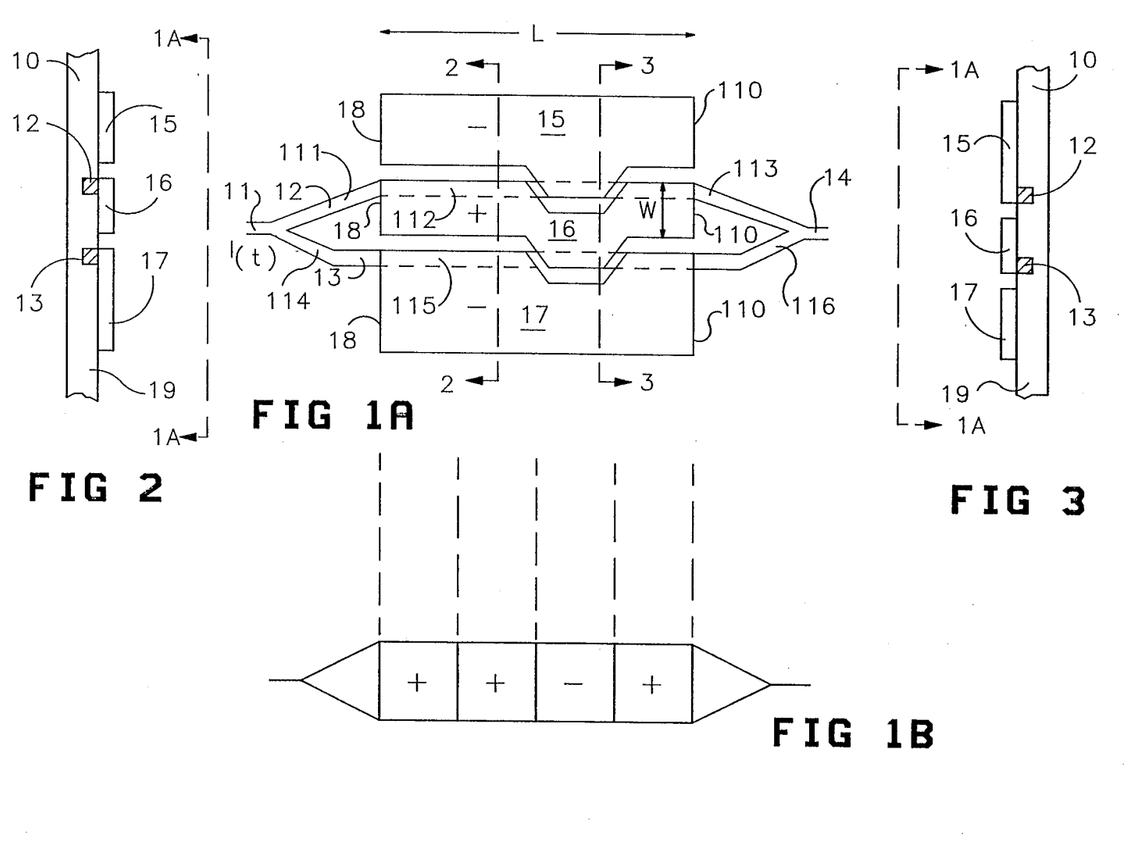
FIG. 1A is a Mach-Zehnder type amplitude modulator having electrodes configured to produce phase reversals in the applied signal in accordance with a spread spectrum pseudorandom code sequence.
FIG. 1B illustrates the correspondence between the polarity reversals in the modulator of FIG. 1B and the Barker Code defining those reversals.
FIGS. 2 and 3 are cross-sections of the modulator of FIG. 1.

In FIGS. 1-3 are shown a top view and two cross-sectional views of a Mach-Zehnder type travelling wave electrooptic amplitude modulator utilizing electrodes that are configured to produce a pattern of electric field reversals in the optical paths of the modulator in accordance with a spread spectrum pseudorandom code. The substrate 10 of the mdulator is a material that transmits optical waves without significant loss and that exhibits at least one index of refraction that is variable in response to an applied electric field. A particularly suitable choice for the substrate is LiNbO$_3$ because it exhibits a particularly strong electrooptic response. The length L of the electrodes is on the order of 1 centimeter.

An optical waveguide 11 is formed in the substrate, for example, by doping the substrate with titanium within the waveguide region of the substrate. Titanium is used as the dopant because it fits easily into the crystal lattice, it diffuses well into the crystal and it increases the indices of refraction so that the doped region functions as an optical waveguide. In the embodiment shown in FIG. 1, waveguide 11 divides into two branches 12 and 13 which recombine into an output path 14. These waveguide segments have cross-sectional dimensions on the order of 5 microns. This structure is known as a Mach-Zehnder modulator and is used to convert the phase modulation produced in branches 12 and 13 into amplitude modulation in output path 14. Typically, branches 12 and 13 will each exhibit two indices of refraction along two principal axis directions perpendicular to the direction of propagation of light in those paths. The light input into waveguide 11 is polarized so that the light in each of branches 12 and 13 is along one of these principal axes. Since each polarization direction functions like a separate channel, if the polarization were not along one of these principal axes, the light beam would travel in both channels at different speeds, thereby producing additional, unwanted phase variations.

A set of electrodes 15-17, overlay portions of branches 12 and 13 in a region in which these two branches are parallel. An applied voltage $V_a$ is applied to these electrodes in such a way that electrode 16 is at the voltage $V_a$ above the voltage of electrodes 15 and 17. These polarities and the locations of the electrodes produce electric fields between the electrodes that are in opposite directions in branches 12 and 13. Thus, when the phase is being retarded in one branch, it is being advanced in the other branch. This push-pull phase modulation relationship between the two branches produces an amplitude modulation in output path 14. This electrode configuration produces electric fields in the optical waveguide branches that are substantially perpendicular to the top surface of the substrate. Therefore, a z-cut LiNbO3 crystal is used because in such a crystal the index of refraction of the crystal is more strongly affected by electric fields perpendicular to the top surface 19 of the substrate than to electric fields in other directions.

$V_a$ is applied to an input end 18 of electrodes 15–17 and produces travelling waves that travel along the electrodes parallel to branches 12 and 13. The other end of each electrode is terminated in a matched impedance to avoid reflections from that end. The group velocity of these applied voltage travelling waves are typically unequal to the group velocity of the optical beams in the optical waveguides. The optical group velocity is on the order of half the speed of light and the group velocity of the applied voltage is on the order of one fourth the speed of light. Therefore, the shapes of the electrodes are selected to produce a set of polarity inversions that compensate for the walkoff between the phase of the electrical and optical signals.

The electrodes are divided into a set of M equal segments along their length and the polarity between the electrodes in these segments is selected in accordance with a spread spectrum pseudorandom code. This electrode structure is applicable not only to the Mach-Zehnder modulator, but is also applicable generally to phase modulators as well as to other types of amplitude modulators. The enhanced operation due to this electrode structure can be seen to result as follows.

The general concept is illustrated under the assumptions that dispersion effects, losses in the optical signal, losses in the applied voltage, and reflections in the electrodes at the output end of the modulator can be neglected. Models taking these factors into account indicate that these neglected effects will not in general qualitatively change these results.

In the end of waveguide 11 an optical travelling wave signa of angular frequency $\omega_o$ is injected and at end 18 of electrodes the applied voltage produces a travelling wave voltage signal $V_a(t-z/v_a)$, where $v_a$ is the group velocity of the applied voltage signal. Half of this optical signal travels through each of branches 12 and 13. In calculating the time delay induced by $V_a$, the distance along branches 12 and 13 will be denoted by z and the origin of the z-axis will be taken as end 18 of electrodes 15–17.

The time delay induced by the applied voltage $V_a$ is on the order of $1/\omega_o$ which is much smaller than both the time duration of each pulse in the optical signal and the transit time for the optical signal to traverse electrodes 15–17. Thus, for purposes of evaluating the electric field experienced by the optical signal as a function of time, its velocity $v_o$ can be treated as constant. The portion of the optical signal arriving at end 110 of the electrodes (i.e., at z=L) at time t thus travels along the path $z=L+v_0\cdot(t'-t)$, where t' is the time at which this portion of the optical signal is at z.

The electrodes introduce field reversals along branches 12 and 13 according to a pattern $$h(z) = \sum_{m=0}^{M-1} P_m \cdot p(z-mw) \quad (5)$$

Thus, the electric field experienced at point z along the electrodes by the portion of the optical signal arriving at end 110 at time t is equal to $$g(z) \cdot V_a(t'-z/v_a) = S \cdot g(z) \cdot V_a[t+(z-L)/v_0 - z/v_a] \quad (6)$$
$$= h(s) \cdot V_a(t-t_0-s) \cdot v_0$$

where $s \equiv z/v_a - z/v_o$, $t_o \equiv L/v_o$, $h(s) \equiv S \cdot g(z) \equiv S \cdot g(s \cdot v_a)/(v_o - v_a)$ and S is a strength factor that takes into account the distance between the electrodes, the geometric arrangement of the electric fields produced by the electordes and the electrooptic responsivity of the modulator waveguides. The time delay $\tau$ induced by $V_a$ in branch 12 is the time integral of this electric field. This can be reexpressed as the convolution $$\tau = \int_{-\infty}^{\infty} h(s) \cdot V_a(t-t_0-s)ds \equiv V_a(t-t_0) \quad (t-t_0) = (7)$$

$$\otimes h(t-t_0) \quad V_a(t-t_0)$$

Therefore, at the output end 110 of electrodes 15–17, the optical travelling wave signal has the form $$(\tfrac{1}{2}) \cdot A(t-t_0) \cdot e^{i\omega_0(t-t_0+\tau)} \quad (8)$$

Because of the push-pull configuration of the electrodes, the phase shift induced by (V(t) in branch 13 is minus that in branch 12. Thus, the optical output signal $O_o(t)$ in optical output 14 is $$O_o(t) = A(t-t'_o) \cdot \cos(\tau) \quad (9)$$

where $t'_o = t_o + L_{113}/v_o$ and $L_{113}$ is the length of branch 113 which is equal to the length of branch 116. The intensity of light in optical output 14 is $$O_o(t) \cdot O^*_o(t) = |A(t-t'_o)|^2 \cdot \cos^2(\tau) = I(t-t'_o) \cdot (\tfrac{1}{2}) \cdot (1+\cos(2\tau)) \quad (10)$$

where $I(t-t'_o)$ is the light intensity that would result if there were no modulation. Thus, the modulator introduces the factor $(1+\cos(2\tau))/2$. When the time to traverse branches 111 and 114 are also taken into account, this shows that the intensity of light in optical output 14 at time t is equal to the input light intensity at time $t - L_{total}/v_o$ times the modulator factor $(1+\cos(2\tau))/2$.

Figure 5:
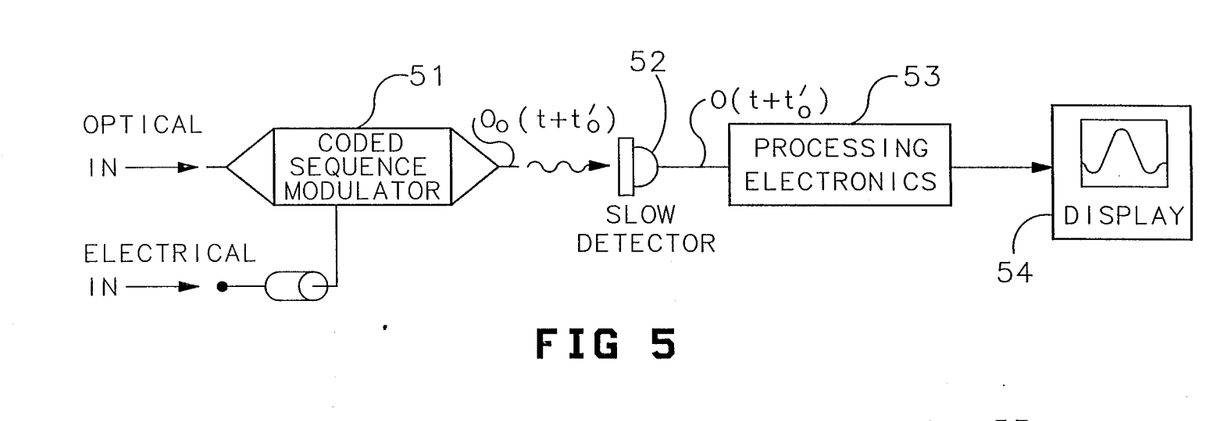
FIG. 5 is a block diagram of the preferred embodiment of the sampler.

In FIG. 5 is a block diagram of the sampler. The output optical signal $O_o(t)$ of a coded switched electrode travelling wave modulator 51 is detected by a slow detector 52. The slow detector has a response time that is long compared to the inverse of the characteristic frequencies of the applied voltage and the optical signal so that the slow detector produces an output signal O(t) that is a time average of the intensity of light in the optical output 14. This time integration converts the product of the light intensity and the mdulation factor into the following convolution $$O(t+t'_o) = I(t) * (1+\cos(2\tau)) \quad (11)$$

Processing eletronics 53 includes an analog-to-digital converter to convert outpt signal $O(t+t'_o)$ to digital data. Processing electronics 53 also includes memory and a central processing unit for processing the digital data. This enables multiple measurements to be averaged and analyzed. A display device 54 connected to processing electronics enables visual display of the data.

Figure 4A:
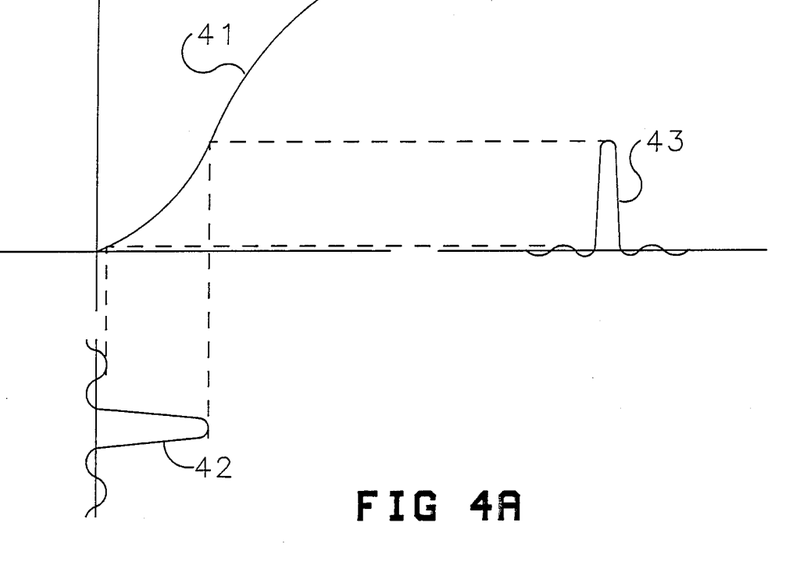
FIGS. 4A and 4B illustrate the effect of the choice of phase $\phi$ on the output signal O(t).
Figure 4B:
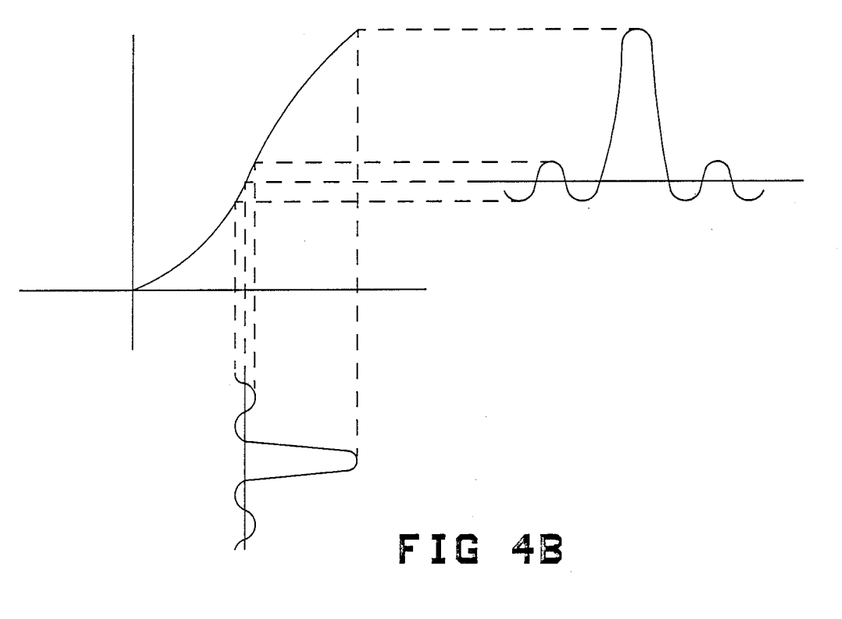

An additional constant phase difference $2\phi$ between the output signals in branches 12 and 13 can be introduced by making the pathlength $L_{12}$ of branch 12 longer than the pathlength $L_{13}$ of branch 13. This is referred to as "geometric biasing". This phase difference can alternatively be introduced by adding a DC offset between electrodes 15 and 17. This is referred to as "electric biasing". With such bias, the modulation factor becomes $(1+\cos(2\tau+\phi))/2$. As discussed below, the value of $\phi$ can be chosen to linearize this modulation factor and can also be chosen to discriminate against unwanted sidelobes in the autocorrelation function of the pseudorandom code P. FIG. 4A illustrates the use of $\phi$ equal to an integer multiple of $\pi$ and FIG. 4B illustrates the use of $\phi$ equal to an odd multiple of $\pi/2$.

It should be noticed from the definitions of correlation and convolution that $h(t)\,V(t)$ is also equal to $h(t)*V(-t)$, that for $\phi$ equal to an odd multiple of $\pi/2$, equation (11) can also be rewritten as $$I(t)*[1+h(t)V(t)] \tag{12}$$

where $\sin[h(t)\,V(t)]$ has been approximated by $h(t)\,V(t)$, and that $I(t)*[h(t)\,V(t)]$ is also equal to $[I(t)*h(t)]\,V(t)$. These relationships will be used to show how use of the above described modulator produces a sampler with an improved resolution-sensitivity product. In equation (12), the term $I(t)*1$ generates a dc component of the output signal $O(t+t'_o)$ proportional to the average value of the input intensity. This term can be easily removed by suitable biasing or arithmetic processing. Thus, this term will be ignored in the following discussion.

Optical Sampler

The electrical signal $V(t)$ is selected to be proportional to $h(-t)$ so that $$h(t)V(t)=h(t)*V(-t)=h(t)*h(t) \tag{13}$$

The function $h(t)$ is also selected to be equal to $$h(z) = \sum_{m=0}^{M-1} P_m \cdot p(z-mw) \tag{5}$$

where $p(t-mw)$ equals one for $mw < t \leq (m+1)w$ and is zero otherwise and where the $P \equiv (P_0, \ldots P_{M-1})$ is a pseudorandom code with small sidelobes. For such a choice, the term $h(t)\,V(t)$ in equation (12) is substantially equal to a single narrow pulse so that the output signal $O(t+t'_o)$ will be a high resolution sample of $I(t)$. $V(t)$ is nonzero only in the interval from $t=0$ to $t=mw$. This interval is referred to as a "shot".

Figure 7:
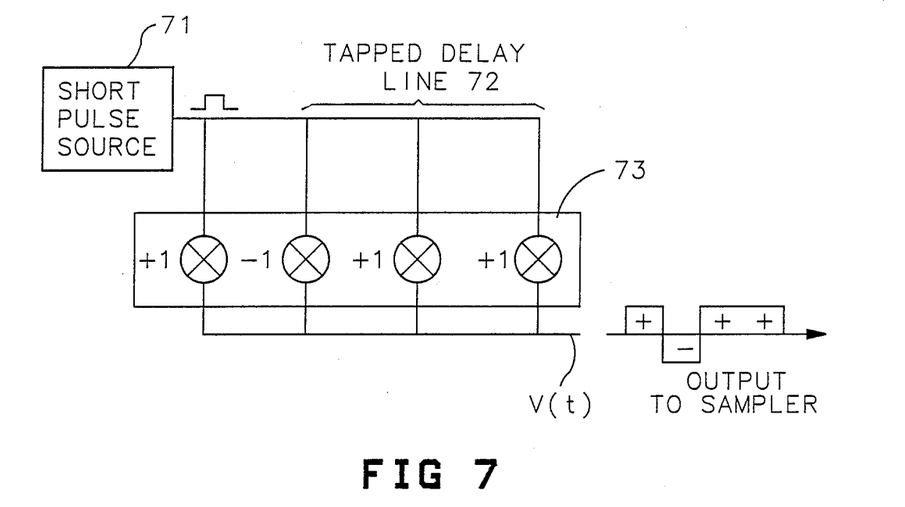
FIG. 7 is a block diagram of a tapped delay line for generating an applied voltage signal V(t) that is a temporal replica of the modulator polarity inversion pattern.

Barker codes are known to have such characteristics. In particular, Barker codes have a central lobe $(P*P)_0$ that is equal to M and has sidelobes (i.e., $(P*P)_k$, for $k \neq 0$) that are $-1, 0,$ or $+1$ (see, for example, R. H. Barker, "Group synchronization of binary digital systems" in W. Jackson, Ed., *Communication Theory*, Academic Press, New York, 1953). Thus, the bandwidth can be increased by a factor on the order of N by use of a Barker code of length N. As illustrated in FIG. 7, this voltage signal can be generated by a cicuit having a short pulse source 71, a tapped microwave delay line 72, a mechaanism 73 for controlling the polarities in each of the taps, and an output line 74 in which the tapped pulses are combined to produce $V(t)$. Such circuits are well known and the details will depend on the frequency domain of operation. The example in FIG. 7 illustrates the particular case in which the pseudorandom code is the Barker code $(+1, -1, +1, +1)$. The modulator in FIG. 1 also implements this Barker code.

In an alternate embodiment, $\phi$ is not chosen to be equal to an odd multiple of $\pi/2$, but is instead chosen to be substantially equal to some multiple of $\pi$. For this choice, equation (12) becomes $$I(t)*[1+\cos(2h(t)V(t))]/2 \tag{14}$$

This embodiment has the advantage of suppressing the sidelobes. This suppression is illustrated in FIG. 4A for the case $\phi=0$. Curve 41 represents the transfer function $[1+\cos(x)]$, curve 42 represents the argument $2h(t)\,V(t)$ in equation (14) and curve 43 represents $[1+\cos(2h(t)\,V(t)]$. Because of the small slope of the curve $1+\cos x$ for small values of x, the sidelobes are suppressed relative to the central lobe.

Figure 6:
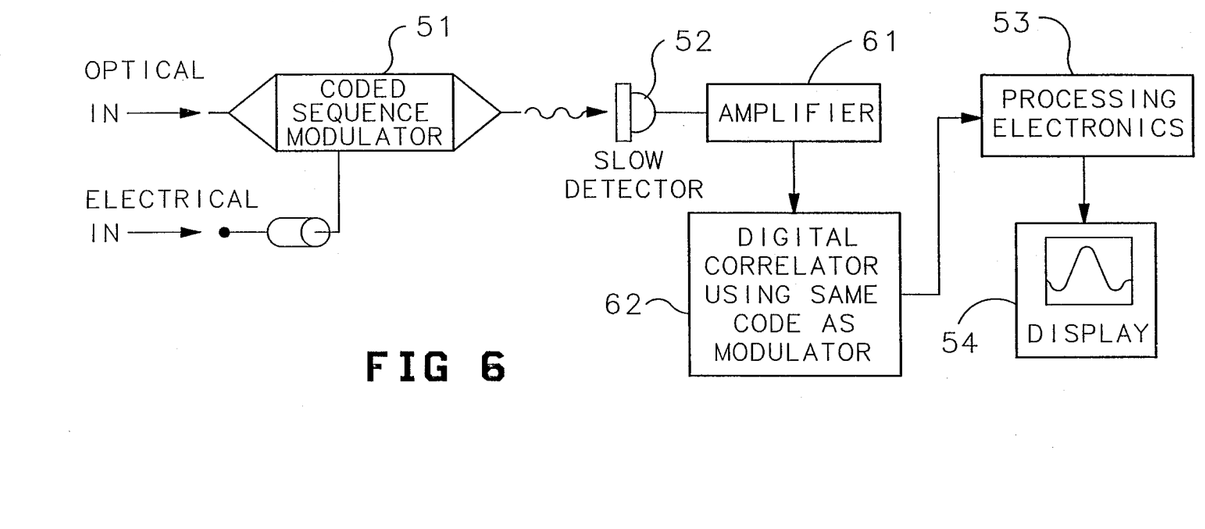
FIG. 6 illustrates an embodiment of the sampler in which the correlation step is performed digitally.

In another embodiment illustrated in FIG. 6, the correlation is performed in a digital rather than an analog fashion by use of a coded applied voltage $V(t)$. In this embodiment, $V(t)$ is a delta function (i.e., a single narrow pulse) so that the output signal $O(t+t'_o)$ is proportional to the convolution of $I(t)$ with $h(t)$. An amplifier 61 amplifies this signal for input to a digital correlator 62 which then correlates this data with $h(t)$ to extract the sample of $I(t)$. The correlator output is supplied to processing electronics 53.

Electrical Sampler

In the electrical sampler, $\phi$ is selected to be an odd multiple of $\pi/2$ so that equation (11) is substantially equal to equation (12), $I(t)$ is selected to be proportional to $h(t)$ and $h(t)$ is again chosen to be generated in accordance with a pseudorandom code having small sidelobes. As indicated just below equation (12), equation (12) can be rewritten as $$I(t)*1 + [I(t)*h(t)]V(t) \tag{15}$$

Figure 8:
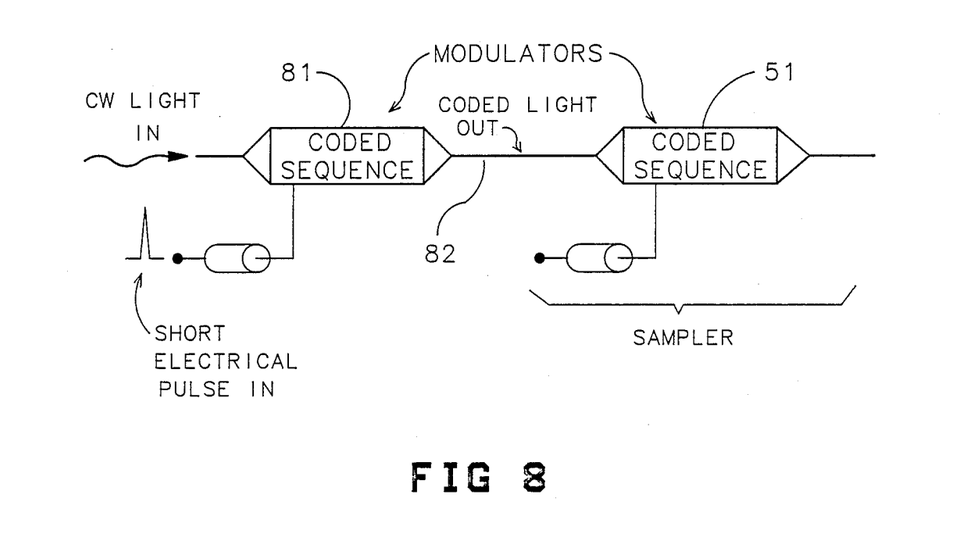
FIG. 8 illustrates an electric signal sampler.

Since $I(t)*h(t)$ is substantially equal to a delta function (i.e., a single narrow pulse), the output signal $O(t+t'_o)$ is equal to a dc term plus a pulse of height proportional to $V(t)$ at the time $I(t)$ first becomes nonzero. As illustrated in the embodiment in FIG. 8, the input optical signal to modulator 51 can be produced by a second coded switched electrode travelling wave modulator 81 having the same code as modulator 51. The optical input signal to modulator 81 is continuous wave light and the electrical input signal is a short electrical pulse. This produces at the optical output 82 of modulator 81 the coded optical signal that is input to modulator 51.

As in the case of the optical sampler, in another embodiment of the electrical sampler, the optical signal is a delta function so that the data stored in memory is the convolution of $h(t)$ with $V(t)$. Correlator 62 then mathematically correlates this data with $h(t)$ to extract the sample of $I(t)$.

Fast Optical Pulse Generator

If the optical input is constant to the modulator of FIG. 1 and the applied voltage is proportional to $h(t)$, then the above discussion shows that the output signal $O(t+t'_o)$ will contain a single narrow pulse. Thus, this device can also be used to produce fast optical pulses.

Golay Code Embodiment

In another embodiment of any of the above devices, the pseudorandom code is a Golay code instead of a Barker code. Golay pair is defined to be a pair of pseudorandom codes $G^1 = (G^1_0, \ldots, G^1_{M-1})$ and $G^2 = (G^1_0, \ldots, G^2_{M-1})$ which satisfy the relationship $$(G^1 * G^1)_k + (G^2 * G^2)_k = 2M \cdot \delta_{0k} \tag{4}$$

where $\delta_{0k}$ is the Kroneker delta function. One embodiment that embodies this code utilizes a pair of modulators as in FIG. 1, the first of which has its electrodes patterned in accordance with $G^1$ and the second of which has its electrodes patterned in accordance with $G^2$. In the optical sampler, the applied voltage for the first of these modulators is a temporal copy of the electrode pattern embodying $G^1$ and the applied voltage for the second of these modulators is a temporal copy of the electrode pattern embodying $G^2$. The output branch 14 of each of these modulators are connected to add the optical output signals from both modulators before detection by detector 52.

Alternatively, in an optical sampler, both codes can be implemented in a single modulator as in FIG. 1. In this case, electrodes 15 and 16 are configured to embody $G^1$ over branch 112 of the optical waveguide and electrodes 16 and 17 are configured to embody $G^2$ over branch 115 of the optical waveguide. The applied voltage to electrode 15 is a temporal copy of the electrode pattern embodying $G^1$ and the applied voltage to electrode 17 is a temporal copy of the electrode pattern embodying $G^2$.

It should be clear that, although both the Golay and Barker codes have values of just $+1$ and $-1$, the sampler design described above is not limited to codes with just these two values. However, for improved signal to noise ratio, it is advantageous to use a code with values of just $+1$ and $-1$. Each bit in the coded input signal functions to sample the other signal as the coded signal moves past the other signal. The correlation operation serves to combine these samples in a way that extracts a single sample of temporal width $L/M \cdot v$, where $v$ is the group velocity of the coded signal. It should also be noticed that the Barker and Golay codes are special cases of a class of pseudorandom codes which satisfy $$\sum_{r=0}^{R-1} \sum_{m=0}^{M-1} P^r_m \cdot Q^r_{m+k} \tag{16}$$

is much smaller for $k \neq 0$ than it is for $k=0$. The Barker and Golay codes are examples in which $P^r_m = Q^r_m$ for each value of r and m from 0 to integer values R and M, respectively. The Barker codes are an example for $R=1$ and the Golay codes are an example for $R=2$.

We claim:

1. A sampler comprising:
a test input for a signal to be sampled;
an output; and
modulation means, responsive to a set of R reference signals $R_r(t)$ ($r=0, \ldots, R-1$) and to a test signal $S(t)$ applied to the test input, for producing at the output an output signal $O(t)$ proportional to $$\sum_{r=0}^{R-1} R_r(t) * [h^r(t) \; S(t)]$$

where $[8 \; h^r(t) S_2(t)]][h^r(t) S(t)]$ denotes the convolution of $h^r(t)$ with $S(t)$, where * denotes the correlation of $R_r(t)$ with $[[h^r(t) S_2(t)]][h^r(t) S(t)]$, where $h^r(t)$ is the impulse response function of the sampler when $S(t)$ and $R^s(t)$ (for $s \neq r$) are constant and $R^r(t)$ is a delta function, and where $$\sum_{r=0}^{R-1} R_r(t) * h^r(t))$$

is substantially equal to a delta function plus an error function that has a peak amplitude much smaller than the integral of the delta function.

2. A sampler as in claim 1 wherein each $h^r(t)$ is substantially equal to $$\sum_{m=0}^{M-1} P^r_m \cdot p(t - mw)$$

wherein each $R^r(t)$ is substantially equal to $$\sum_{m=0}^{M-1} Q^r_m \cdot p(t - mw)$$

where $p(t-mw)$ equals 1 if $m \cdot w < t \leq (m+1) \cdot w$ and where $$\sum_{r=0}^{R-1} \sum_{m=0}^{M-1} P^r_m \cdot Q^r_{m+k}$$

is much smaller for $k \neq 0$ than it is for $k=0$.

3. A sampler as in claim 2 wherein $R=1$ and wherein $P^0_m$ for each value of m and wherein $(P^0_0, \ldots, P^0_{M-1})$ is a Barker code.

4. A sampler as in claim 2 wherein said modulation means comprises a coded switched electrode travelling wave modulator having R optical paths, the rth such optical path having an associated coded switched electrode for modulating the optical signal in that path in accordance with the code $(P^r_0, \ldots, P^r_{M-1})$.

5. A sampler as in claim 4 wherein said test input is electrically connected to each of the coded switched electrodes; said sampler further comprising:
optical input means for applying an optical signal $R_r(t)$ to an input of the rth optical path (for $r=0, \ldots, R-1$).

6. A sampler as in claim 5 wherein said optical input means comprises, at an input of the rth optical path (for $r=0, \ldots, R-1$), an associated coded switched electrode travelling wave modulator having an electrode coded in accordance with the code $(Q^r_0, \ldots, Q^r_{M-1})$.

7. A sampler as in claim 4 wherein the test input is optically coupled to the input of each of the optical paths; said sampler further comprising:
electrical input means for applying an electrical signal $R_r(t)$ to the coded electrode of the rth reference optical path (for $r=0, \ldots, R-1$), whereby the sampler functions as an optical signal sampler.

8. A sampler as in claim 7 wherein said electrical input means comprises, coupled to an input to the coded electrodes of the rth optical path (for $r=0, \ldots, R-1$), a tapped delay line in which the taps produce an electrical signal that is coded in accordance with the code $Q^r$.

9. A sampler as in claim 2 wherein $R=2$, wherein $P^r_m = Q^r_m$ for each value of r and m, wherein $(P^0_0, \ldots$ , $P^0_{M-1}$) is a Golay code $G^1$ of length M and wherein $(P^1_0, \ldots, P^1_{M-1})$ is the Golay code G2 conjugate to $G^1$.

10. A sampler as in claim 1 wherein the modulation means includes:
a set of R channels $0, \ldots, R-1$;
in the rth channel, an intermediate digital electrical signal $I_r(t)$ is produced equal to $[h^r(t)S(t)]$;
each reference signal $R_r(t)$ is substantially equal to a delta function so that the intermediate electrical signal $I_r(t)$ is substantially equal to $h^r(t)S(t)$;
said modulation means further comprising:
a digital correlator for digitally correlating each $I_r(t)$ with $R^r(t)$ and producing the output signal O(t) as the sum of these digital correlations.

11. A sampler as in claim 7 wherein S(t) is substantially constant, whereby the sampler functions as a fast optical pulse generator.

12. A sampler as in claim 4 wherein the coded switched electrode travelling wave modulator is of the Mach-Zehnder type.

13. A sampler as in claim 4 wherein each optical path contains a Mach-Zehnder modulator and each of these optical paths has its output coupled to a common optical output to produce the output signal as the sum of the output signals from these optical paths.

14. A sampler as in claim 4 wherein the travelling wave modulator has a single optical input path that branches into R optical paths that merge at a common optical output, each branch having its own associated set of coded switched electrodes, the rth such branch coded with the code $(P^r_1, \ldots P^r_{R-1})$.

15. A sampler as in claim 12 wherein R=2 and wherein the electrode configurations and the bias voltages produce a push-pull relationship between these two optical paths so that a voltage signal applied to the electrodes produces a phase shift in one optical path that is minus the phase shift in the other.

16. A sampler as in claim 15 wherein the travelling wave modulator has a geometric bias that introduces an additional constant phase offset between the two branches.

17. A sampler as in claim 15 wherein the travelling wave modulator has an electrical bias that introduces an additional constant phase offset between the two branches.

18. A sampler as in claim 15 wherein the Mach-zehnder modulator has two optical paths that, in response to an electrical signal at the coded switched electrode, are in a push-pull phase shift relationship, and that have an additional phase offset of an odd multiple of $\pi/2$, whereby the output signal O(t) is a substantially linear function of the applied voltage and optical signals.

19. A sampler as in claim 15 wherein the Mach-Zehnder modulator has two optical paths that, in response to an electrical signal at the coded switched electrode, are in a push-pull phase shift relationship, and that have an additional phase offset of an even multiple of $\pi/2$, whereby the portion of the output signal O(t) is suppressed that arises from sidelobes in the correlation $$\sum_{r=0}^{R-1} R_r(t)*h^r(t)),$$

* * * * *